United States Patent [19]

Yoshioka et al.

[11] Patent Number: 4,746,596
[45] Date of Patent: May 24, 1988

[54] METHOD FOR MICROFABRICATION OF PATTERN ON SUBSTRATE USING X-RAY SENSITIVE RESIST

[75] Inventors: Nobuyuki Yoshioka; Yoshiki Suzuki, both of Itami, Japan

[73] Assignee: Mitsubishi Denki Kabushiki Kaisha, Tokyo, Japan

[21] Appl. No.: 813,864

[22] Filed: Dec. 27, 1985

[51] Int. Cl.$^4$ .............................................. G03C 5/00
[52] U.S. Cl. .................................. 430/325; 430/966; 430/967; 430/331; 430/270; 430/296
[58] Field of Search .............. 430/966, 967, 325, 331, 430/296, 270

[56] References Cited

U.S. PATENT DOCUMENTS 4,535,054  8/1985  Brault et al. ............... 430/331 X
4,551,417  11/1985  Suzuki et al. ................ 430/313 X

OTHER PUBLICATIONS

"Polychloromethylstyrene: A high performance X-ray resist", by H. S. Choong and F. J. Kahn; J. Vac. Sci. Thecnol. B. vol. 1, No. 1, No. 4, 1983, pp. 1066–1071.

Primary Examiner—Paul R. Michl
Assistant Examiner—Cynthia Hamilton
Attorney, Agent, or Firm—Lowe, Price, Leblanc, Becker & Shur

[57] ABSTRACT

A method for microfabrication of a pattern on a substrate in accordance with the present invention comprises steps of; forming a thin film of X-ray sensitive resist of chlorinated polymethylstyrene on the substrate, wherein the chlorinated polymethylstyrene has an average molecular weight of 400,000–700,000 and a chlorine content of 20–40 wt. % and contains fundamental monomer structure of

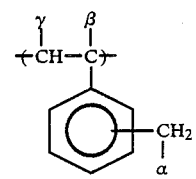

where at least one of the atom sites $\alpha$, $\beta$ and $\gamma$ is occupied by chlorine instead of hydrogen; selectively exposing the film to Pdl$_\alpha$ radiation; developing the exposed film with ethoxyethanol and/or methoxyethanol.

3 Claims, 6 Drawing Sheets

X, Y, Z : Cl or H

METHOD FOR MICROFABRICATION OF PATTERN ON SUBSTRATE USING X-RAY SENSITIVE RESIST

DETAILED DESCRIPTION OF THE INVENTION

1. Field of the Invention

The present invention relates to a method of microfabrication using an X-ray sensitive negative resist in a manufacturing process of a semiconductor integrated circuit.

2. Description of the Prior Art

In a pattern forming process for manufacturing a semiconductor integrated circuit, a method using a photoresist sensitive to visible light or ultraviolet (UV) is widely put into practical use. Recently, in order to enhance the performance of an integrated circuit, there is an intense demand for high integration of devices, and studies on fabrication techniques for ultrafine circuit patterns are being conducted. Under the circumstances, an exposure technique using an X-ray of shorter wavelength instead of a conventionally utilized UV ray has been developed for forming a highly precise circuit pattern. According to this technique, in manufacturing an integrated circuit, a resist material is supplied on a substrate to form a thin film and an X-ray is selectively irradiated to desired portions of the resist thin film, which is then developed to form a fine pattern.

For exposure to an X-ray, a soft X-ray source excited by an electron beam which is accelerated with 10–20 kV is widely utilized and the characteristic X-ray of the target material is used for the exposure. The characteristic X-ray from the source in X-ray exposure apparatus which are now developing is usually AlK$_\alpha$ (8.34 Å), SiK$_\alpha$ (7.13 Å), MoL$_\alpha$ (5.41 Å), RhL$_\alpha$ (4.6 Å) or PdL$_\alpha$ (4.37 Å). Among the above characteristic X-rays, PdL$_\alpha$ (4.37 Å) has a shorter wavelength compared with the others and therefore has an excellent transmissibility with respect to a mask substrate material such as polyimido, BN or SiN, an X-ray output Be window of an exposure apparatus and He gas or the like as an atmosphere for exposure. Therefore, an X-ray exposure system using PdL$_\alpha$ radiation has attracted special interest because of the advantages thereof such as a small loss in the intensity of X-ray attaining to the resist surface, a good transmissibility with respect to organic dust or dirt and thus a decrease of pattern defects.

On the other hand, an X-ray sensitive resist in a manufacturing process of integrated circuits using an X-ray exposure system is required to have a high sensitivity for shortening the exposure time despite a low X-ray emission efficiency of the X-ray source excited by an electron beam and is also required to have a high resolution suitable for microfabrication with an accuracy of 1 μm or submicron. In addition, recently, a dry etching technique by gas plasma or reactive sputter etching is widely utilized in the etching process and accordingly, materials having excellent resistance characteristic for such etching atmosphere are required.

For exposure to an X-ray, an absorptive Au pattern having a large X-ray absorption coefficient is formed on an X-ray mask substrate so as to selectively irradiate the resist. The thickness of the Au film serving as the absorptive pattern is related to a contrast value $\gamma$ of the utilized resist (this value being defined as the X-ray dose rate dependency of the normalized thickness calculated from a residual film thickness after exposure and development, i.e., $(\log D_g^1/D_g^0)^{-1}$ assuming that dose rates at the points of intersection between the extrapolated line of a straight portion in the sensitivity curve and the normalized thickness 0 and 1 are respectively $D_g^0$ and $D_g^1$). FIG. 1 shows the thickness of Au film required for the $\gamma$ value of resist in case where the normalized thickness of the resist pattern is a practical value of 0.9 to 1.0 in an X-ray exposure process using PdL$_\alpha$ radiation. As seen from FIG. 1, the thickness of the Au film needs to be 1.0 μm or more when the $\gamma$ value of resist is 1.0. However, it is difficult to form an Au pattern having a thickness of more than 1 μm and a width of a submicron and accordingly, a practical value of the thickness of the Au pattern with the resolution of submicron is approximately less than 1 μm.

Therefore, a resist material having a value $\gamma$ is 1.0 or more is required as a practically usable X-ray sensitive resist material.

Conventional resist materials are mainly composed of light elements such as carbon C, oxygen O and hydrogen H. Since these light elements have small absorption coefficients for PdL$_\alpha$ radiation, most of the materials are not highly sensitive to PdL$_\alpha$ radiation. Although improvement has been tried to obtain a new resist material having higher sensitivity to PdL$_\alpha$ radiation by making the material contain chlorine having a larger absorption coefficient for PdL$_\alpha$ radiation (for example, see "Polychloromethylstyrene: A high performance X-ray resist" by H. S. Choong and F. J. Kahn; J. Vac. Sci. Technol. B, Vol. 1, No. 1, No. 4, 1983), there are few materials having high resolution and excellent dry etching resistance characteristic with the value $\gamma$ of more than 1.

The inventors of the present invention noticed a chlorinated styrene system for a resist material satisfying all the above stated requirements. Chlorinated polymethylstyrene commercially available as a negative resist sensitive to electron beams is known as a material having excellent dry etching resistance characteristics since it contains the aromatic ring in the monomer structure in the polymerized molecule.

FIG. 2 shows a fundamental molecular structure formula of chlorinated polymethylstyrene. At least one of the atom sites X, Y and Z is appropriately occupied by chlorine instead of hydrogen. The commercially available chlorinated polymethylstyrene for conventional use with electron beams has an average molecular weight $\overline{M_w}$ of approximately $2 \times 10^5$ and a chlorine content of approximately 5 wt. %. It has excellent dry etching resistance characteristics, high resolution with the value $\gamma$ of 1 or more and high sensitivity to electron beams. However, the sensitivity $D_g^{0.5}$ thereof represented as the X-ray dose rate causing the normalized thickness for the PdL$_\alpha$ radiation to be 0.5 is as low as 130 mJ/cm², which does not attain the practical sensitivity as a PdL$_\alpha$ radiation sensitive resist.

Isoamyl acetate or ethylcellosolve acetate have been conventionally used as a solvent for developing the chlorinated polymethylstyrene film. However, such a solvent tends to cause swellings in the resist film during the development. The swellings result in windings and/or bridges in the developed pattern, so that it is hard to form a good submicro-pattern.

SUMMARY OF THE INVENTION

It is therefore a primary purpose of the present invention to provide a method for forming a submicro-pattern on a substrate which has high resolution and excellent dry etching resistance characteristic.

A method of microfabrication using X-ray sensitive resist in a pattern forming process in accordance with the present invention comprises steps of: forming a thin film of X-ray sensitive resist of chlorinated polymethylstyrene on the substrate, wherein the chlorinated polymethylstyrene has an average molecular weight of 400,000-700,000 and a chlorine content of 20-40 wt. % and contains fundamental monomer structure of

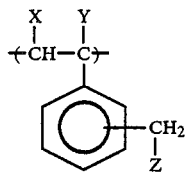

where at least one of the atom sites X, Y and Z is occupied by chlorine instead of hydrogen; selectively exposing the film to $PdL_\alpha$ radiation; and developing the exposed film with ethoxyethanol and/or methoxyethanol.

These objects and other objects, features, aspects and advantages of the present invention will become more apparent from the following detailed description of the present invention when taken in conjunction with the accompanying drawings.

EMBODIMENT OF THE INVENTION

In the following, an embodiment of the present invention will be described based on the results of the studies conducted by the inventors of the present invention as to the characteristics of chlorinated polymethylstyrene irradiated by $PdL_\alpha$ radiation.

Figure 1:
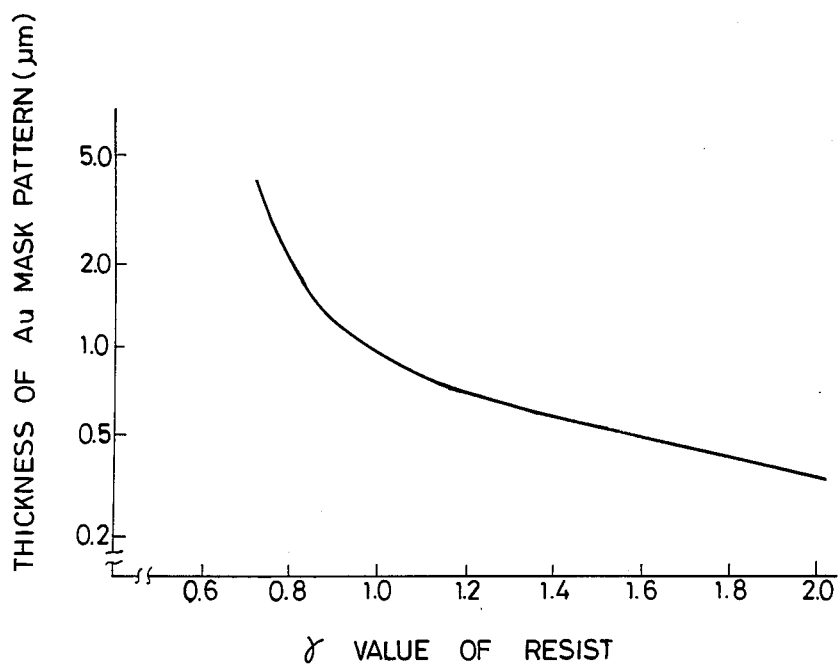
FIG. 1 is a graph showing a thickness of Au mask pattern required for the contrast value $\gamma$ of the resist exposed to $PdL_\alpha$ radiation.
Figure 2:
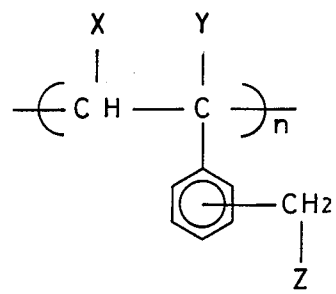
FIG. 2 is an illustration of a fundamental molecular structure formula of chlorinated polymethylstyrene.
Figure 3:
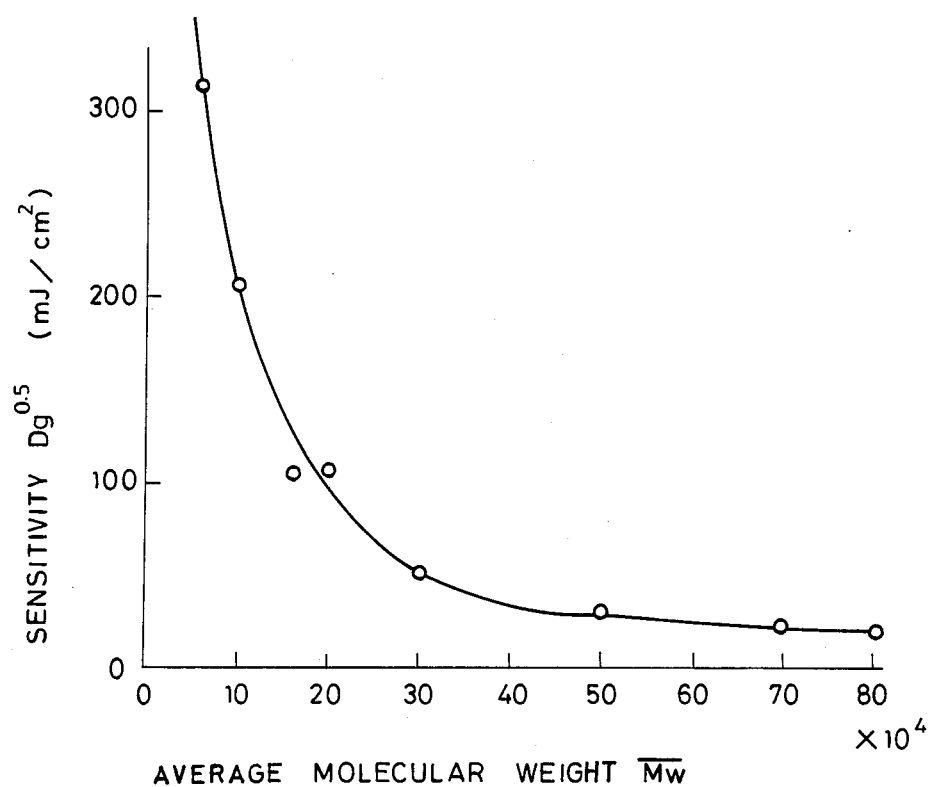
FIG. 3 is a graph showing the relation between the average molecular weight $\overline{M_w}$ and the sensitivity $D_g^{0.5}$ of chlorinated polymethylstyrene having a chlorine content of 10 wt. %.

FIG. 3 shows the relation between the weight average molecular weight $\overline{M_w}$ and the sensitivity $D_g^{0.5}$ of the chlorinated polymethylstyrene having a chlorine content of 10 wt. % investigated by the present inventors. Generally, the sensitivity of negative resist depends on the molecular weight $\overline{M_w}$. As shown in FIG. 3, the sensitivity $D_g^{0.5}$ of chlorinated polymethylstyrene to $PdL_\alpha$ radiation becomes higher according to the increase of the molecular weight $M_w$. The sensitivity $D_g^{0.5}$ is 210 mJ/cm² with the molecular weight $M_w$ of $1 \times 10^5$, while 34 mJ/cm² with $\overline{M_w}$ of $5 \times 10^5$. Further, since chlorinated polymethylstyrene contains chlorine having a large absorption coefficient for $PdL_\alpha$ radiation, a higher sensitivity may be realized by increasing the chlorine content.

Figure 4:
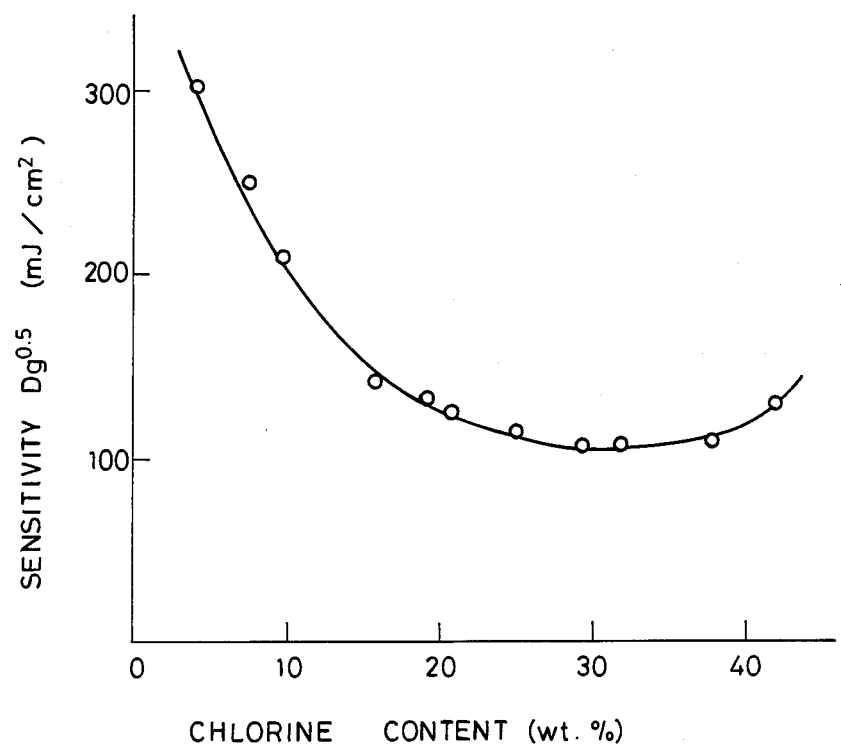
FIG. 4 is a graph showing the relation between the chlorine content and the sensitivity $D_g^{0.5}$ of chlorinated polymethylstyrene having a molecular weight $\overline{M_w}$ of $1 \times 10^5$.

FIG. 4 shows the result of the investigation conducted by the present inventors as to the relation between the chlorine content and the sensitivity of chlorinated polymethylstyrene having a molecular weight $\overline{M_w}$ of $1 \times 10^5$. As shown in FIG. 4, the sensitivity $D_g^{0.5}$ of chlorinated polymethylstyrene to $PdL_\alpha$ radiation becomes high according to the increase of the chlorine content. The sensitivity $D_g^{0.5}$ is 300 mJ/cm² with the chlorine content of 5 wt. %, while 110 mJ/cm² with 30 wt. %. As seen in FIG. 4, however, the highest sensitivity appears within the range of the chlorine content of about 25-40 wt. % and then decreases as the increase of the chlorine content in the range of more than 40 wt. %.

Further, the present inventors made investigation on solvents in order to find out an optimum developer for forming a submicro-pattern of the chlorinated polymethylstyrene film. As a result, it is found that ethoxyethanol or methoxyethanol is satisfactory for the developer.

Figure 5:
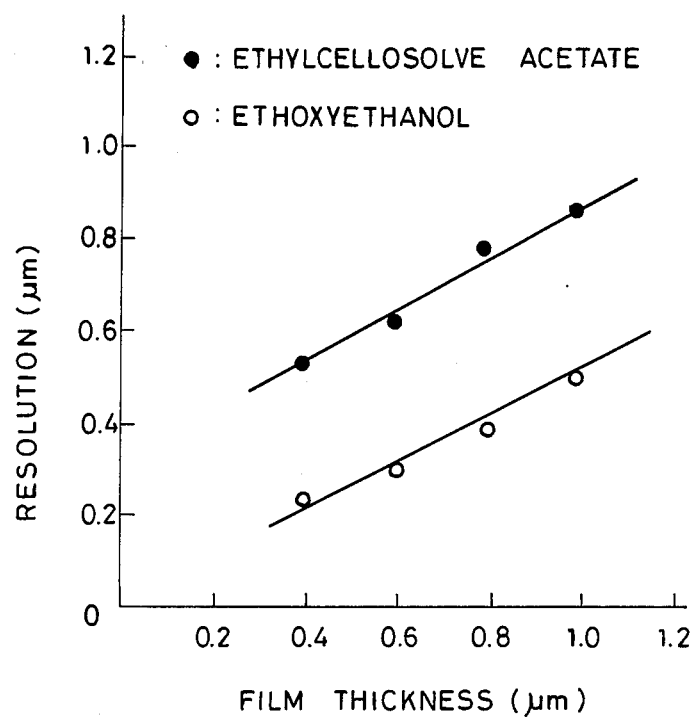
FIG. 5 is a graph showing the relation between the resolution and the thickness of chlorinated polymethylstyrene film having a molecular weight $\overline{M_w}$ of $5.2 \times 10^5$ and a chlorine content of 28 wt. %, with respect to two different developers of ethylcellosolve acetate and ethoxyethanol.

FIG. 5 shows the relation between the resolution and the initial thickness of chlorinated polymethylstyrene film having a molecular weight $\overline{M_w}$ of $5.2 \times 10^5$ and a chlorine content of 28 wt. %, with respect to different developers. The horizontal axis represents the initial film thickness before the $PdL_\alpha$ irradiation. The vertical axis represents the resolvable minimum width of a pattern after developing to a normalized thickness of 0.7. As seen from FIG. 5, ethoxyethanol used as the developer in the present invention provides much better resolution than ethylcellosolve acetate which is one of the conventional developer solvents. A mixed solvent of ethoxyethanol and isoamyl acetate is also found to provide high resolution. Further, such high resolution can be also obtained using methoxyethanol instead of ethoxyethanol.

However, it is found that chlorinated polymethylstyrene having a low chlorine content can not be developed by ethoxyethanol or methoxyethanol.

Figure 6:
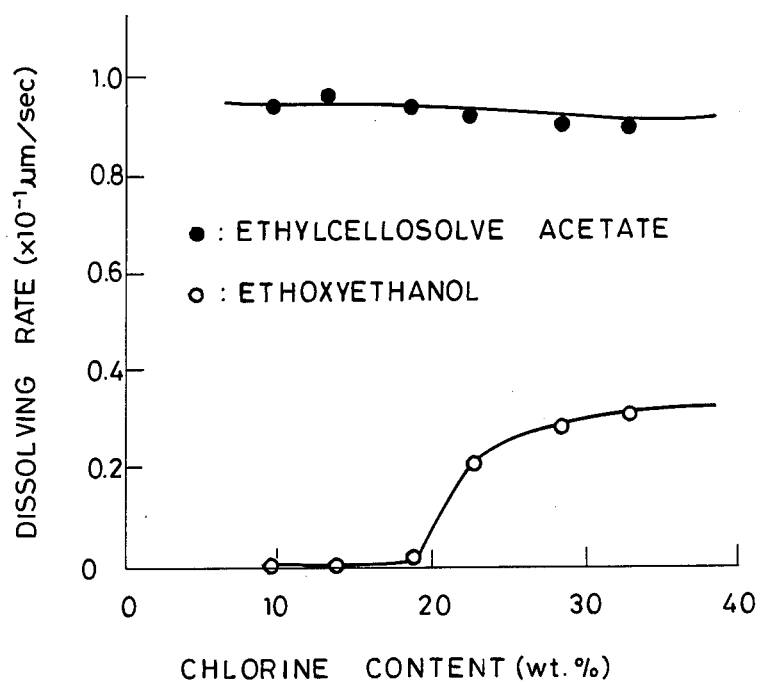
FIG. 6 is a graph showing the relation between the dissolving rate and the chlorine content of unexposed chlorinated polymethylstyrene film, with respect to the different solvents.

FIG. 6 shows the relation between the dissolving rate and the chlorine content of chlorinated polymethylstyrene film unexposed to $PdL_\alpha$ radiation, with respect to the different solvent. As seen in FIG. 6, the dissolving rate with ethylcellosolve acetate is substantially constant regardless of the chlorine content, while the dissolving rate with ethoxyethanol is negligibly small in regard to the chlorine content of less than 19 wt. %. Consequently, it is found that the chlorine content should be more than 20 wt. % in order to reduce the developing period to a practical time of about one minute.

As described above, chlorinated polymethylstyrene can be made to have a high sensitivity by increasing both the molecular weight $\overline{M_w}$ and the chlorination ratio. However, it was also made clear by the present inventors that the value $\gamma$ indicating contrast of resist is less than 1.0 in the case of the molecular weight being more than $7\times10^5$ and in the case of chlorine content being more than 35 wt. %.

It was also made clear by the present inventors that the viscosity of resist becomes higher if the molecular weight $\overline{M_w}$ of chlorinated polymethylstyrene attains more than $7\times10^5$ and when the resist is coated on the substrate by a rotational coating method, nonuniformity in the film thickness occurs. Further, it was made clear by the present inventors that the dry etching resistance characteristic of chlorinated polymethylstyrene does not depend on the molecular weight $\overline{M_w}$ and the chlorine content.

Based on the above described results of the studies conducted by the present inventors as to the characteristics of chlorinated polymethylstyrene irradiated by $PdL_\alpha$ radiation, it becomes clear that chlorinated polymethylstyrene having excellent characteristics such as high sensitivity to $PdL_\alpha$ radiation, the value $\gamma$ of more than 1.0, high resolution and excellent dry etching characteristics exists in the range of the molecular weight $\overline{M_w}$ of $4\times10^5$ to $7\times10^5$ and the chlorine content of 25-30 wt. %.

In the following, an example will be shown in which a fine pattern was formed using as negative resist sensitive to $PdL_\alpha$ radiation, chlorinated polymethylstyrene with the conditions of a molecular weight of $5.2\times10^5$ and a chlorine content of 25 wt. %, which satisfy the above stated requirements.

First, a uniform film of the above stated resist having a thickness of approximately 0.8 μm was formed on a substrate of silicon or the like by a rotational coating method. After this film was selectively exposed to $PdL_\alpha$ radiation, the exposed film was developed with ethoxyethanol and then rinsed.

Figure 7:
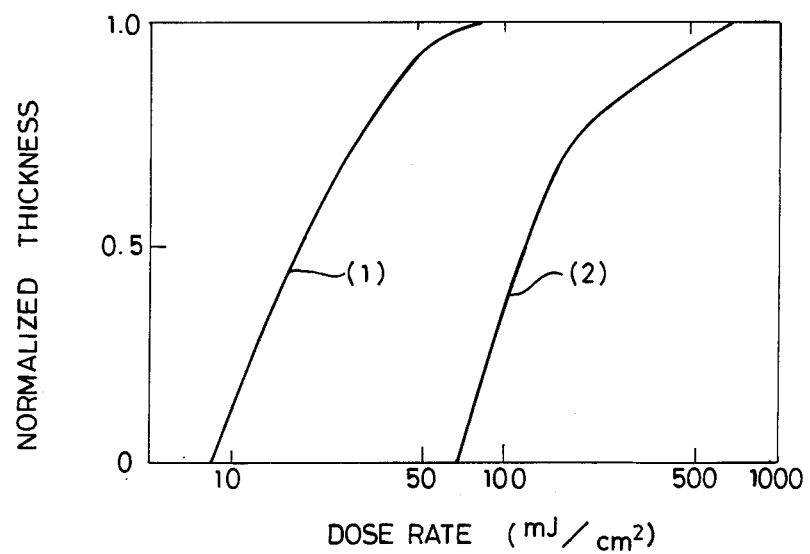
FIG. 7 shows a curve (1) of sensitivity of chlorinated polymethylstyrene for $PdL_\alpha$ radiation in accordance with an embodiment of the present invention, as compared with a curve (2) of conventional chlorinated polymethylstyrene for EB resist.

Referring to FIG. 7, the curve (1) indicates the sensitivity of this resist to $PdL_\alpha$ radiation, while the curve (2) indicates the sensitivity of commercially available chlorinated polymethylstyrene for conventional use with electron beam. This resist (1) has a sensitivity approximately 7.6 times as high as that of the conventional resist (2). The sensitivity $D_g^{0.5}$ of this resist was 17 mJ/cm$^2$ and the value $\gamma$ thereof was 1.25.

Subsequently, the resist film on the substrate formed by the same coating conditions as described above was selectively exposed with the dose rate causing a normalized thickness of 70% and the resist film was then developed and rinsed in the same manner as described above. As a result, a pattern having a resolution of 0.4 μm was obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for microfabrication of a pattern on a substrate comprising the steps of:

forming a thin film of X-ray sensitive resist of chlorinated polymethylstyrene on said substrate, wherein said chlorinated polymethylstyrene has an average molecular weight of 400,000–700,000 and a chlorine content of 20–40 wt. % and contains fundamental monomer structure of

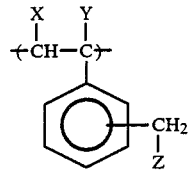

where X, Y and Z are individually hydrogen or chlorine and at least one of X, Y and Z is chlorine instead of hydrogen, selectively exposing said film to $PdL_\alpha$ radiation, and developing said exposed film with a developer comprising ethoxyethanol or methoxyethanol.

2. The method of claim 1, wherein said chlorinated polymethylstyrene preferably has an average molecular wight of 500,000–600,000 and a chlorine content of 25–35 wt. %.

3. The method of claim 1, wherein said developer is selected from the group consisting of ethoxyethanol and methoxyethanol.

* * * * *